(12) United States Patent
Gupta et al.

(10) Patent No.: US 8,867,694 B1
(45) Date of Patent: Oct. 21, 2014

(54) MODULAR GRAY CODE COUNTER

(71) Applicants: Naman Gupta, Delhi (IN); Gaurav Goyal, Dehradun (IN); Rohit Goyal, Noida (IN)

(72) Inventors: Naman Gupta, Delhi (IN); Gaurav Goyal, Dehradun (IN); Rohit Goyal, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/945,937

(22) Filed: Jul. 19, 2013

(51) Int. Cl.
*H03K 21/00* (2006.01)
*H03K 23/00* (2006.01)

(52) U.S. Cl.
CPC .................................. *H03K 23/005* (2013.01)
USPC ............................................. 377/34; 377/118

(58) Field of Classification Search
None
See application file for complete search history.

(56) References Cited

U.S. PATENT DOCUMENTS

| | | | | |
|---|---|---|---|---|
| 5,164,968 | A * | 11/1992 | Otto | 377/34 |
| 5,448,606 | A * | 9/1995 | Snelgrove | 377/34 |
| 6,269,138 | B1 * | 7/2001 | Hansson | 377/26 |
| 6,314,154 | B1 | 11/2001 | Pontius | |
| 6,931,091 | B2 * | 8/2005 | Heimbigner | 377/34 |
| 6,950,138 | B2 * | 9/2005 | Hamaguchi | 348/312 |
| 7,596,201 | B2 * | 9/2009 | Fujimura | 377/34 |
| 7,991,104 | B1 | 8/2011 | Dahan | |
| 2003/0179848 | A1 * | 9/2003 | Nakamura | 377/34 |

OTHER PUBLICATIONS

Cohn, Martin and Even, Shimon, "A Gray Code Counter," IEEE Trans. on Computers, vol. C-18, pp. 662-664, Jul. 1969.
D. C. Hendry, "Sequential lookahead method for digital counters," IEEE Electron. Lett., vol. 32, No. 3, pp. 160-161, Feb. 1996.
R. F. Jones, Jr. and E. E. Swartzlander, Jr., "Parallel counter implementation," Proc. 10th Symp. Comput. Arith., 1992, pp. 382-385.
A. P. Kakarountas, G. Theodoridis, K. S. Papadomanolakis, and C. E. Goutis, "A novel high-speed counter with counting rate independent of the counter's length," Proc. IEEE Int. Conf. Electron., Circuits Syst. (ICECS), UAE, Dec. 2003, pp. 1164-1167.
Qing Wu et al., "Clock-Gating and Its Application to Low Power Design of Sequential Circuits," IEEE Transactions on Circuits and Systems-1: Fundamental Theory and Applications, vol. 47, No. 103, Mar. 2000, pp. 415-420.

* cited by examiner

*Primary Examiner* — Tuan T Lam
(74) *Attorney, Agent, or Firm* — Charles Bergere

(57) ABSTRACT

A Gray code counter has multiple two-bit Gray code counter modules, clock gated integrated cells (CGICs), and a parity bit generator. The CGICs gate clock signals provided to the two-bit counter modules, which reduces dynamic power consumption. The parity bit generator generates a parity bit that indicates a count of binary ones in a counting state.

6 Claims, 5 Drawing Sheets

US 8,867,694 B1

MODULAR GRAY CODE COUNTER

BACKGROUND OF THE INVENTION

The present invention relates generally to digital circuits and counters, and more particularly to a Gray code counter.

Counters are digital logic circuits used for counting occurrences of an event with respect to a clock signal. Examples of counters include asynchronous, synchronous, decade, and Gray code counters. Gray code counters are those in which any two successive counting states differ by only one bit. For example, a two-bit Gray code counter has the following counting states: 00→01→11→10, where any two successive states differ by just one-bit position.

A conventional n-bit Gray code counter has $2^n$ counting states and uses 'n' flip-flops for generating these states. The flip-flops operate on a clock signal that is received at respective clock input terminals. The clock signal toggles at the clock input terminals even when the output of the corresponding flip-flop is not altered. This leads to a continuous charging and discharging at nodes internal to the flip-flops, which in turn leads to dynamic power dissipation.

Gray code counters are used extensively in digital logic design applications for sharing multi-bit count information between synchronous logic circuits that operate at different clock frequencies. Since conventional Gray code counter design is not modular by nature, complicated Karnaugh maps need to be solved to design a higher order Gray code counter (five bits or more) from a lower order Gray code counter. Solving higher order Karnaugh maps is a laborious task and leads to inefficiency during the design phase of a product. Additionally, the maximum operating frequency of conventional Gray code counters is limited by the size of the fan-in cone of the flip-flops, and operating the conventional Gray code counter at high frequencies leads to considerable dynamic power dissipation.

Therefore, it would be advantageous to have a Gray code counter that is modular, has low dynamic power dissipation, and can operate at high frequencies.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1A:
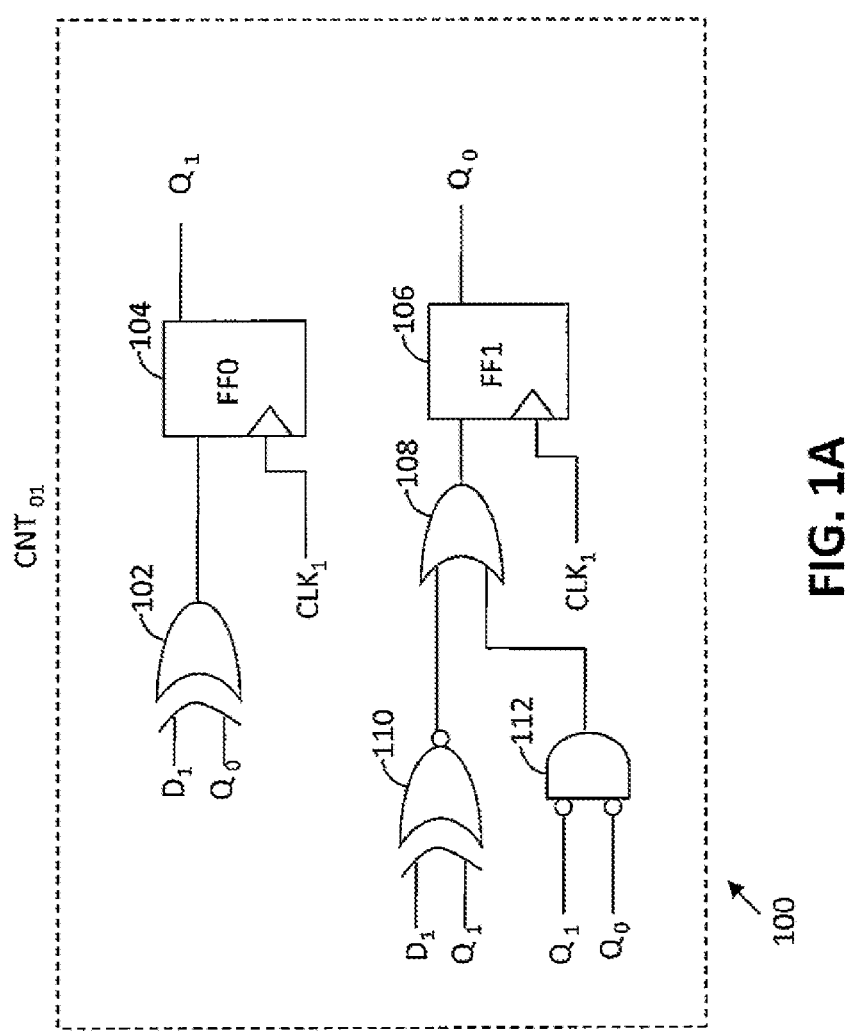
FIG. 1A is a schematic block diagram of a two-bit Gray code counter in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a Gray code counter is provided. The Gray code counter includes a first counter circuit for receiving a first direction bit and a first gated clock signal, and generating zeroth and first Gray code bits. The Gray code counter further includes a first AND gate for receiving an inverted zeroth Gray code bit and a parity bit, and generating a first enable signal. A first NOT gate is connected to the output of the first AND gate and receives the first enable signal and generates an inverted first enable signal. A first CGIC is connected to the first NOT gate and receives the inverted first enable signal and a clock signal, and generates the first gated clock signal. A second CGIC is connected to the output terminal of the first AND gate and receives the first enable signal and the clock signal, and generates a second gated clock signal. A first flip-flop has an input terminal that receives an inverted first direction bit, a clock input terminal connected to the second CGIC for receiving the second gated clock signal, and an output terminal connected to the first counter circuit. The first flip-flop provides the first direction bit at its output terminal. A second NOT gate is connected to the output terminal of the first flip-flop for receiving the first direction bit, and connected to the input terminal of the first flip-flop. The second NOT gate generates the inverted first direction bit.

The Gray code counter further includes a first OR gate for receiving the first Gray code bit and a second Gray code bit, and generating a first intermediate signal. A second AND gate is connected to an output terminal of the first AND gate for receiving the first enable signal and to the output terminal of the first OR gate for receiving the first intermediate signal, and generates a second enable signal.

A third CGIC receives as inputs the second enable signal and the clock signal, and generates a third gated clock signal. A second counter circuit receives a second direction bit and the third gated clock signal, and generates the second Gray code bit and a third Gray code bit. A fourth CGIC receives a third enable signal and the clock signal and generates a fourth gated clock signal. A second flip-flop having an input terminal for receiving an inverted second direction bit is connected to the fourth CGIC. The second flip-flop also has a clock input terminal connected to the fourth CGIC for receiving the fourth gated clock signal, and an output terminal connected to the second counter circuit. The second flip-flop generates the second direction bit at its output terminal. A third NOT gate is connected to the output terminal of the second flip-flop for receiving the second direction bit, and connected to the input terminal of the second flip-flop. The third NOT gate generates the inverted second direction bit. A NOR gate receives the zeroth through second Gray code bits and generates a second intermediate signal. A third AND gate is connected to an output terminal of the NOR gate for receiving the second intermediate signal and the parity bit, and generating the third enable signal. The fourth CGIC and a fifth CGIC are connected to an output terminal of the third AND gate and receive the third enable signal. The fifth CGIC also receives the clock signal and generates a fifth gated clock signal. A third counter circuit receives a third direction bit and the fifth gated clock signal and generates fourth and fifth Gray code bits.

In another embodiment of the present invention, a two-bit Gray code counter is provided. The two-bit Gray code counter includes a XOR gate for receiving a first direction bit and a zeroth Gray code bit, and generating a first intermediate signal. A first flip-flop has an input terminal connected to an output terminal of the XOR gate for receiving the first intermediate signal, and a clock input terminal for receiving a first gated clock signal, and generates a first Gray code bit. An XNOR gate receives the first direction bit and the first Gray code bit and generates a second intermediate signal. A first AND gate receives an inverted zeroth and first Gray code bits and generates a third intermediate signal. A first OR gate is connected to an output terminal of the XNOR gate for receiving the second intermediate signal and to the first AND gate for receiving the third intermediate signal, and generates a fourth intermediate signal. A second flip-flop having an input terminal connected to an output terminal of the first OR gate for receiving the fourth intermediate signal, and a clock input terminal for receiving the first gated clock signal, generates the zeroth Gray code bit.

In yet another embodiment of the present invention, a Gray code counter stage of an n-bit Gray code counter is provided. The Gray code counter stage includes a first OR gate for receiving (n−4)th and (n−5)th Gray code bits and generates a first intermediate signal. A first AND gate is connected to an output terminal of the first OR gate for receiving the first intermediate signal and a first enable signal, and generates a second enable signal. The first enable signal is generated based on a parity bit and a zeroth Gray code bit. A first CGIC receives as inputs the second enable signal and a clock signal and generates a first gated clock signal. A first counter circuit receives the first gated clock signal and a first direction bit and generates the (n−4)th Gray code bit and an (n−3)th Gray code bit.

A second CGIC receives a third enable signal and the clock signal and generates a second gated clock signal. A first flip-flop has an input terminal for receiving an inverted first direction bit, a clock input terminal connected to the second CGIC for receiving the second gated clock signal, and an output terminal connected to the first counter circuit. The first flip-flop generates the first direction bit. A first NOT gate is connected to the output terminal of the first flip-flop for receiving the first direction bit, and is connected to the input terminal of the first flip-flop. The first NOT gate generates the inverted first direction bit. A NOR gate receives the zeroth Gray code bit, and first through (n−4)th Gray code bits and generates a second intermediate signal. A second AND gate is connected to the output terminal of the NOR gate for receiving the second intermediate signal and the parity bit. The second AND gate generates the third enable signal, which is provided to the second CGIC. A third CGIC receives the third enable signal and the clock signal and generates a third gated clock signal. A second counter circuit receives a second direction bit and the third gated clock signal and generates (n−1)th and (n−2)th Gray code bits.

Various embodiments of the present invention provide a Gray code counter and a stage of a Gray code counter. The Gray code counter includes multiple flip-flops that are connected to generate Gray code bits. Since all Gray code bits of an n-bit Gray code counter do not toggle at each clock cycle, the clock signals provided to the flip-flops of non-toggling Gray code bits are gated so that the clock signals do not toggle unnecessarily at the respective clock input terminals. This leads to a reduction in dynamic power dissipation of the Gray code counter. The Gray code counter stage can be used to form a higher order Gray code counter and lend modularity to the Gray code counter design, which eliminates the need for solving Karnaugh maps for generating a circuit design of a higher order Gray code counter. Additionally, the Gray code counter of the present invention is capable of operating at high frequencies. Since, the Gray code counter uses clock gating, operating the Gray code counter at high frequencies does not translate into a substantial increase in the dynamic power dissipation.

Referring now to FIG. 1A, a schematic block diagram of a two-bit Gray code counter 100 in accordance with an embodiment of the present invention is shown. The two-bit Gray code counter 100 includes a XOR gate 102, first and second flip-flops 104 and 106, an OR gate 108, an XNOR gate 110, and an AND gate 112.

The XOR gate 102 receives a first direction bit ($D_1$) and a zeroth Gray code bit ($Q_0$) and generates a first intermediate signal. In an embodiment of the present invention, the first direction bit $D_1$ controls counting-up and counting-down of the two-bit Gray code counter circuit 100. For example, if $D_1=0$ and a current counting state is '00', then the two-bit Gray code counter circuit 100 counts up and transitions to a successive counting state, i.e., '01'. In another example, if $D_1=1$ and a current counting state is '11', then the two-bit Gray code counter circuit 100 counts down and transitions to a previous counting state, i.e., '01'.

A data input terminal of the first flip-flop 104 is connected to an output terminal of the XOR gate 102 for receiving the first intermediate signal, and a clock terminal of the first flip-flop 104 receives a first gated clock signal $CLK_1$. The first flip-flop 104 generates a first Gray code bit ($Q_1$) at its output terminal. In an embodiment of the present invention, the first gated clock signal $CLK_1$ is generated by a first clock gating integrated cell (CGIC) based on a clock signal, which will be discussed later in conjunction with FIG. 1B.

The XNOR gate 110 receives the first direction bit $D_1$ and the first Gray code bit $Q_1$ and generates a second intermediate signal. The AND gate 112 receives inverted versions of the zeroth and first Gray code bits $Q_0$ and $Q_1$ (that is $/Q_0$ and $/Q_1$ are input to the AND gate 112) and generates a third intermediate signal. The OR gate 108 receives the second and third intermediate signals from the XNOR gate 110 and the AND gate 112, respectively, and generates a fourth intermediate signal. The second flip-flop 106 receives the fourth intermediate signal at its data input terminal and the first gated clock signal $CLK_1$ at its clock input terminal and generates the zeroth Gray code bit $Q_0$ at its output terminal.

Figure 1B:
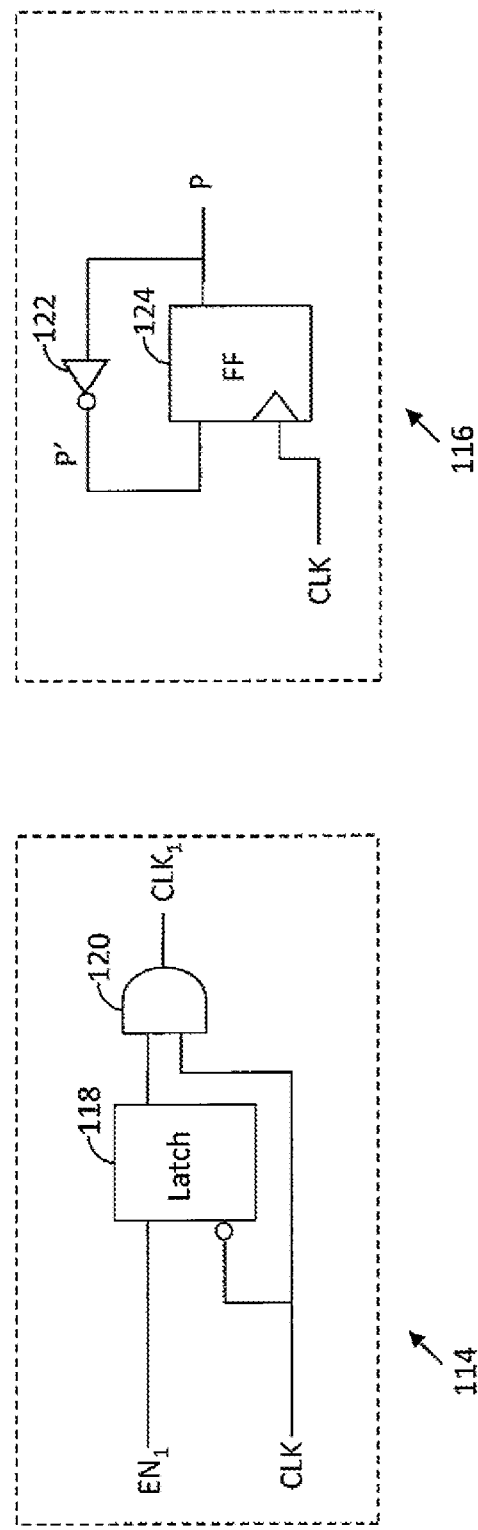
FIG. 1B is a schematic block diagram of a clock gating integrated cell (CGIC) and a parity bit generator in accordance with an embodiment of the present invention.

Referring now to FIG. 1B, schematic block diagrams of a CGIC 114 and a parity bit generator 116 in accordance with embodiments of the present invention are shown. The CGIC 114 includes a latch 118 and an AND gate 120, while the parity bit generator 116 comprises a NOT gate 122 and a flip-flop 124.

The latch 118 receives a first enable signal $EN_1$ at its data input terminal and a clock signal CLK at its clock input terminals. In an embodiment of the present invention, the first enable signal $EN_1$ is generated based on a zeroth Gray code bit $Q_0$ and a parity bit P as will be explained in conjunction with FIG. 2. The data output of the latch 118 is provided to the AND gate 120. The AND gate 120 also receives the clock signal CLK and generates the first gated clock signal $CLK_1$.

The parity bit generator 116 generates the parity bit P. The flip-flop 124 receives an inverted parity bit (P') at its data input terminal and the clock signal CLK at its clock input terminal, and generates the parity bit P at its output terminal. The NOT gate 122 receives the parity bit P and generates the inverted parity bit P' that provided to the input terminal of the flip-flop 124.

Figure 2:
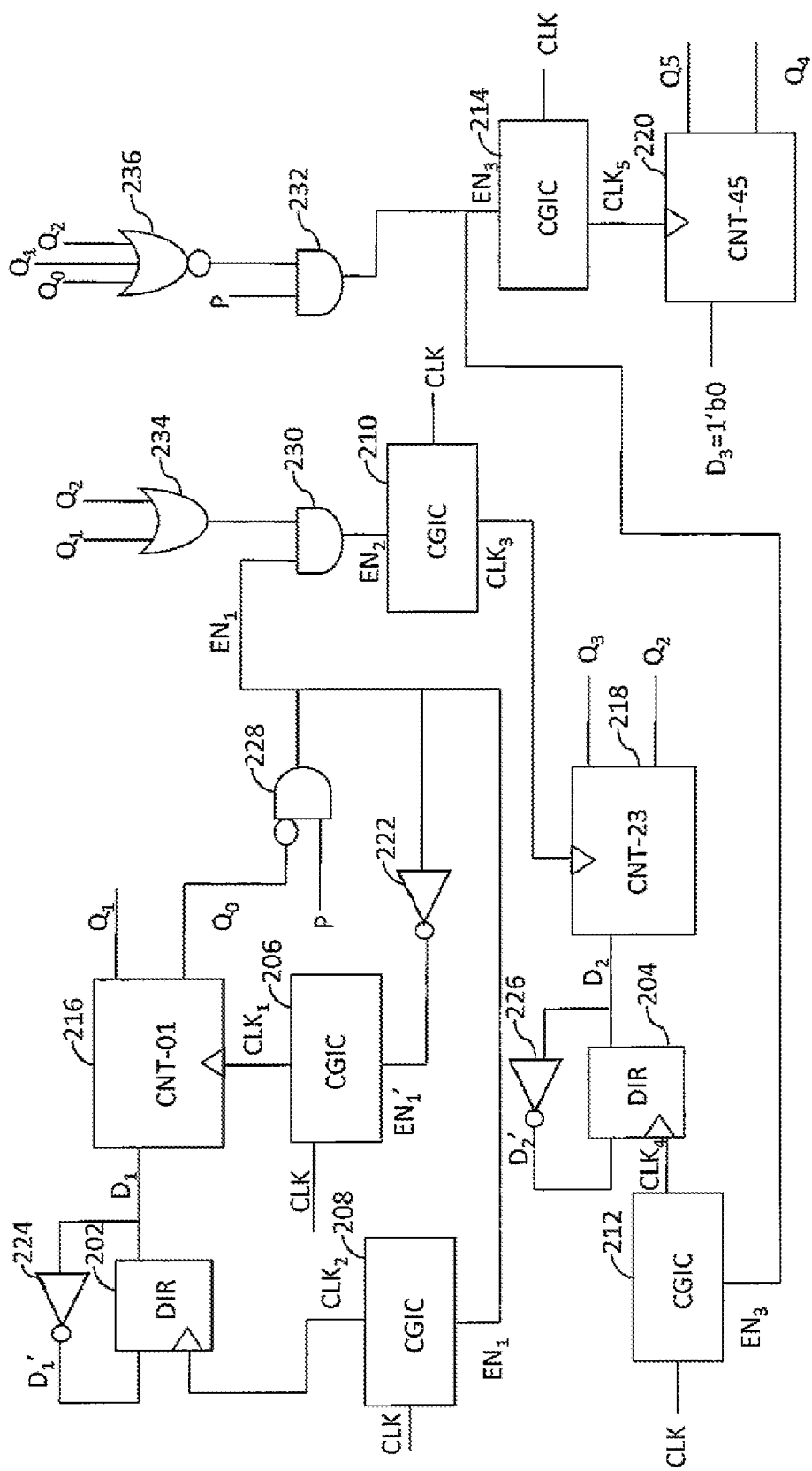
FIG. 2 is a schematic block diagram of a six-bit Gray code counter in accordance with an embodiment of the present invention.

Referring now to FIG. 2, a schematic block diagram of a six-bit Gray code counter circuit 200 in accordance with an embodiment of the present invention is shown. The six-bit Gray code counter circuit 200 includes first and second flip-flops 202 and 204, first through fifth CGICs 206-214, first through third counter circuits 216-220, first through third NOT gates 222-226, first and second AND gates 228-232, an OR gate 234, and a NOR gate 236.

The first counter circuit 216 receives a first direction bit $D_1$ and a first gated clock signal $CLK_1$ and generates zeroth and first Gray code bits $Q_0$ and $Q_1$. The first counter circuit 216 is identical (operation and circuit construction wise) to the two-bit Gray code counter 100 described above in conjunction with FIG. 1A. The first CGIC 206 receives an inverted first enable signal $EN_1'$ and a clock signal CLK and generates the first gated clock signal $CLK_1$. The first CGIC 206 is identical in operation and circuit construction to the first CGIC 114 described above in conjunction with FIG. 1B.

The first AND gate 228 receives an inverted zeroth Gray code bit $Q_0'$ and a parity bit (P), and generates a first enable signal $EN_1$. The parity bit P is generated by the parity bit generator 116 described above in conjunction with FIG. 1B. The first enable signal $EN_1$ is input to the second NOT gate 222, which then generates the inverted first enable signal $EN_1'$.

The second CGIC 208 receives the clock signal CLK and the first enable signal $EN_1$ and generates a second gated clock signal $CLK_2$. The second CGIC 208 transmits the second gated clock signal $CLK_2$ to a clock input terminal of the first flip-flop 202. The first flip-flop 202 also receives an inverted first direction bit $D_1'$ at its data input terminal and then generates the first direction bit $D_1$. The first direction bit $D_1$ is provided to the first counter 216 and to the second NOT gate 224, which generates and provides the inverted first direction bit $D_1'$ to the input terminal of the first flip-flop 202.

The OR gate 234 receives the first Gray code bit $Q_1$ and a second Gray code bit $Q_2$. An output of the OR gate 234 is connected to an input of the second AND gate 230. The second AND gate also receives the first enable signal $EN_1$, and then generates a second enable signal $EN_2$, which is provided to the third CGIC 210. The third CGIC 210 also receives the clock signal CLK, and generates a third gated clock signal $CLK_3$. The third gated clock signal $CLK_3$ is provided to the second counter circuit 218. The second counter circuit 218 also receives a second direction bit $D_2$ and generates the second Gray code bit $Q_2$ and a third Gray code bit $Q_3$.

The fourth CGIC 212 receives the clock signal CLK and a third enable signal $EN_3$ and generates a fourth gated clock signal $CLK_4$, which is provided to a clock input terminal of the second flip-flop 204. The second flip-flop 204 also receives an inverted second direction bit $D_2'$ at its data input terminal and generates the second direction bit $D_2$ at its output terminal. The second direction bit $D_2$ is provided to the second counter circuit 218, and also input to the third NOT gate 226, which then generates the inverted second direction bit $D_2'$.

The NOR gate 236 receives the zeroth, first and second Gray code bits $Q_0$-$Q_2$ and then generates an output that is input to the third AND gate 232. The third AND gate 232 also receives the parity bit P and generates the third enable signal $EN_3$. The third enable signal $EN_3$ is output by the third AND gate 232 and provided to the fourth and fifth CGICs 212 and 214. The fifth CGIC 214 also receives the clock signal CLK, and then generates a fifth gated clock signal $CLK_5$. The fifth gated clock signal $CLK_5$ is input to the third counter circuit 220. The third counter circuit 220 also receives a third direction bit $D_3$. In an embodiment of the present invention, the third direction bit $D_3$ is a binary zero. The third counter circuit 220 then generates fourth and fifth Gray code bit $Q_4$ and $Q_5$.

Figure 3:
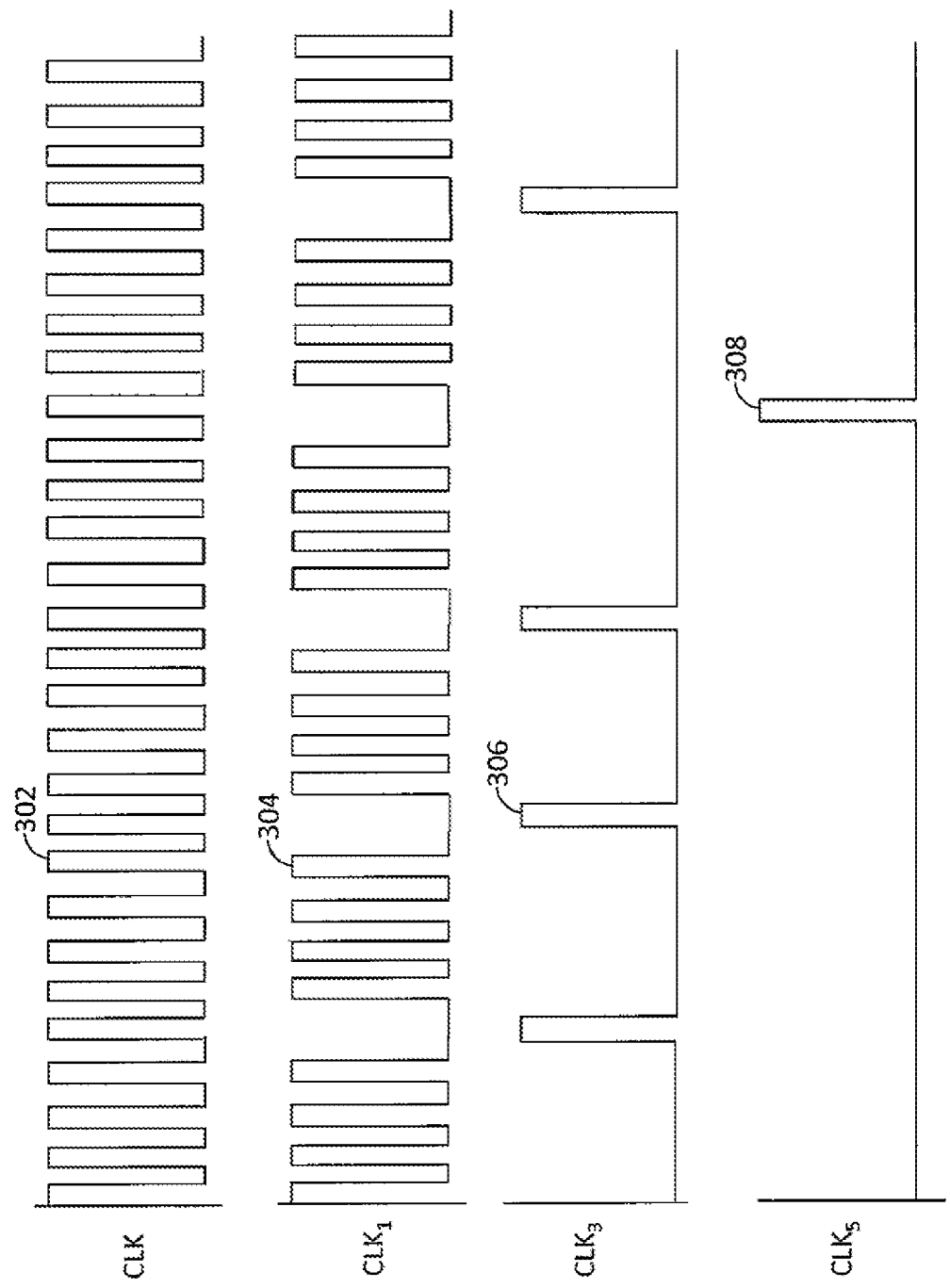
FIG. 3 is a timing diagram of waveforms corresponding to a clock signal and first through third gated clock signals in accordance with an embodiment of the present invention.

FIG. 3 is a timing diagram of first through fourth waveforms 302-308. The first waveform 302 corresponds to the clock signal CLK, which is un-gated and toggles continuously. The second waveform 304 corresponds to the first gated clock signal $CLK_1$, the third waveform 306 corresponds to the third gated clock signal $CLK_3$, and the fourth waveform 308 corresponds to the fifth gated clock signal $CLK_5$. The first, third, and fifth gated clock signals $CLK_1$, $CLK_3$, and $CLK_5$ do not toggle continuously, which reduces the charging/discharging at the clock input terminals of the flip-flops internal to the first through third counter circuits 216-220, thereby leading to reduced dynamic power dissipation.

Figure 4:
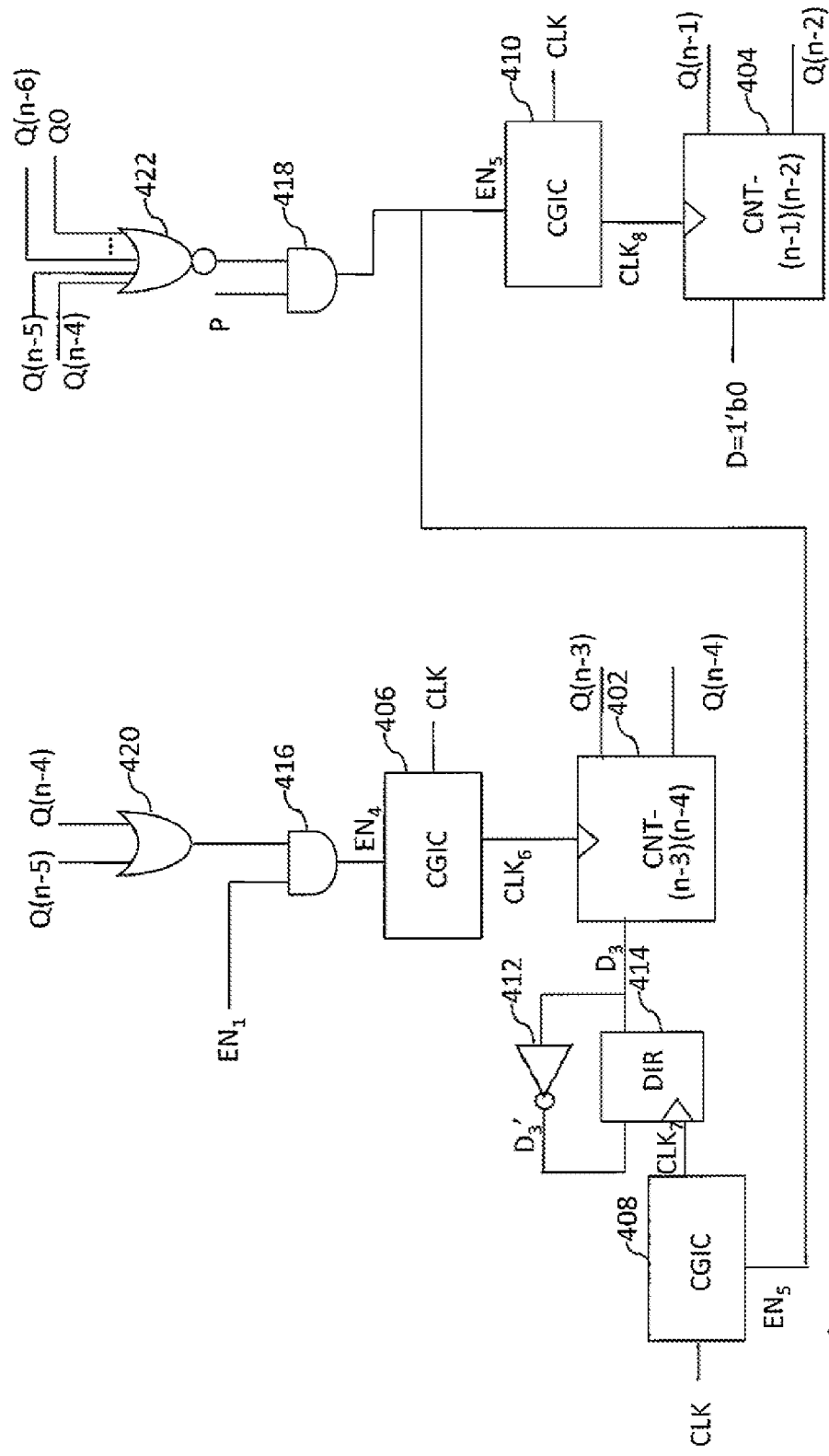
FIG. 4 is a schematic block diagram of a Gray code counter stage of an n-bit Gray code counter in accordance with an embodiment of the present invention.

Referring now to FIG. 4, a schematic block diagram of a Gray code counter stage 400 of an n-bit Gray code counter in accordance with an embodiment of the present invention is shown. The Gray code counter stage 400 includes first and second counter circuits 402 and 404, first through third CGICs 406-410, a NOT gate 412, a flip-flop 414, first and second AND gates 416 and 418, a OR gate 420, and a NOR gate 422. FIG. 4 will be explained in conjunction with FIG. 2.

The OR gate 420 receives (n−4)th and (n−5)th Gray code bits $Q_{(n-4)}$ and $Q_{(n-5)}$. In an embodiment of the present invention, 'n' is a positive, even integer. The output of the OR gate 420 is provided to an input of the first AND gate 416. The first AND gate 416 also receives the first enable signal $EN_1$, and then the first AND gate generates a fourth enable signal $EN_4$. The fourth enable signal $EN_4$ and the clock signal CLK are input to the first CGIC 406, which generates a sixth gated clock signal $CLK_6$. The sixth gated clock signal $CLK_6$ is provided to the first counter circuit 402. The first counter circuit 402 also receives a third direction bit $D_3$ and generates a (n−3)th Gray code bit $Q_{(n-3)}$ and the (n−4)th Gray code bit $Q_{(n-4)}$.

The second CGIC 408 receives the clock signal CLK and a fifth enable signal $EN_5$ and generates a seventh gated clock signal $CLK_7$, which is provided to a clock input terminal of the flip-flop 414. The flip-flop 414 also receives an inverted third direction bit $D_3'$ at its data input terminal and then generates the third direction bit $D_3$ at its output terminal. The flip-flop 414 transmits the third direction bit $D_3$ to the first counter circuit 402 and to the NOT gate 412. The NOT gate 412 then generates the inverted third direction bit $D_3'$.

The NOR gate 422 receives the zeroth through (n−4)th Gray code bits $Q_0$-$Q_{(n-4)}$ and generates an output that is input to the second AND gate 418. The second AND gate 418 also receives the parity bit P, and generates the fifth enable signal $EN_5$. The fifth enable signal $EN_5$ is provided to the second and third CGICs 408 and 410. The third CGIC 410 also receives the clock signal CLK and generates an eighth gated clock signal $CLK_8$, which is provided to the second counter circuit 404. The second counter circuit 404 also receives a direction bit, which in this embodiment is a binary zero, and then generates (n−1)th and (n−2)th Gray code bits $Q_{(n-1)}$ and $Q_{(n-2)}$.

While various embodiments of the present invention have been illustrated and described, it will be clear that the present invention is not limited to these embodiments only. For example, although specific gate types (e.g., AND, OR, NOT, etc.) are shown in the drawings, one of skill in the art will understand that different combinations of logic gates can be used to generate the same or equivalent signals, and that either positive or negative logic can be used to generate the same or equivalent signals. Therefore, numerous modifications, changes, variations, substitutions, and equivalents will be apparent to those skilled in the art, without departing from the spirit and scope of the present invention, as described in the claims.

The invention claimed is:

1. A Gray code counter circuit, comprising:
   a first counter circuit (216) for receiving a first direction bit and a first gated clock signal and generating zeroth and first Gray code bits;
   a first AND gate (228) for receiving an inverted zeroth Gray code bit and a parity bit and generating a first enable signal;
   a first NOT gate (222) connected to an output terminal of the first AND gate for receiving the first enable signal and generating an inverted first enable signal;
   a first Clock Gating Integrated Cell (CGIC) (206) connected to the first NOT gate for receiving the inverted first enable signal, and a clock signal, and generating the first gated clock signal;
   a second CGIC (208) connected to the output terminal of the first AND gate for receiving the first enable signal, and the clock signal, and generating a second gated clock signal;
   a first flip-flop (202) that receives an inverted first direction bit at a data input terminal, and the second gated clock signal at a clock input terminal, and generates the first direction bit;
   a second NOT gate (224) connected to the output terminal of the first flip-flop for receiving the first direction bit, and providing the inverted first direction bit to the first flip-flop;
   a first OR gate (234) for receiving the first Gray code bit and a second Gray code bit and generating a first intermediate signal;
   a second AND gate (230), connected to the output terminal of the first AND gate for receiving the first enable signal and to an output terminal of the first OR gate for receiving the first intermediate signal, for generating a second enable signal;
   a third CGIC (210), connected to the output terminal of the second AND gate for receiving the second enable signal, and the clock signal, for generating a third gated clock signal;
   a second counter circuit (218) that receives a second direction bit and the third gated clock signal, and generates the second Gray code bit and a third Gray code bit;
   a fourth CGIC (212) for receiving a third enable signal and the clock signal and generating a fourth gated clock signal;
   a second flip-flop (204) that receives an inverted second direction bit at its data input terminal and the fourth gated clock signal at its clock input terminal, and generates the second direction bit;
   a third NOT gate (226) that receives the second direction bit and generates the inverted second direction bit;
   a NOR gate (236) for receiving the zeroth, first and second Gray code bits and generates a second intermediate signal;
   a third AND gate (232) that receives the second intermediate signal and the parity bit, and generates the third enable signal;
   a fifth CGIC (214) that receives the third enable signal and the clock signal, and generates a fifth gated clock signal; and
   a third counter circuit (220) for receiving a third direction bit and the fifth gated clock signal, and generating fourth and fifth Gray code bits.

2. The Gray code counter circuit of claim 1, wherein the third direction bit is binary zero.

3. The Gray code counter circuit of claim 1, wherein the first counter circuit includes:
   a XOR gate (102) that receives the first direction bit and the zeroth Gray code bit and generates a third intermediate signal;
   a third flip-flop (104) having a data input terminal connected to an output terminal of the XOR gate for receiving the third intermediate signal, and a clock input terminal connected to the first CGIC for receiving the first gated clock signal, wherein the third flip-flop generates the first Gray code bit at an output terminal thereof;
   a XNOR gate (110) for receiving the first direction bit and the first Gray code bit and generating a fourth intermediate signal;
   a fourth AND gate (112) that receives inverted zeroth and first Gray code bits and generates a fifth intermediate signal;
   a second OR gate (108) that receives the fourth and fifth intermediate signals and generates a sixth intermediate signal; and
   a fourth flip-flop (106) that receives the sixth intermediate signal at its data input terminal and the first gated clock signal at its clock input terminal and generates the zeroth Gray code bit.

4. The Gray code counter circuit of claim 3, wherein the first CGIC includes:
   a latch (118) having a data input terminal that receives the inverted first enable signal, and a clock input terminal that receives an inverted clock signal, and a data output terminal that provides a seventh intermediate signal; and
   a fifth AND gate (120) that receives the seventh intermediate signal and the clock signal and generates the first gated clock signal.

5. The Gray code counter circuit of claim 1, wherein the parity bit is generated using a parity bit generator.

6. The Gray code counter circuit of claim 5, wherein the parity bit generator comprises:
   a fifth flip-flop (124) having a data input terminal for receiving an inverted parity bit, and a clock input terminal for receiving the clock signal, and an output terminal for providing the parity bit; and
   a fourth NOT gate (122) connected to the output terminal of the fifth flip-flop for receiving the parity bit and generating the inverted parity bit.

* * * * *